United States Patent
Lee

(10) Patent No.: US 7,439,175 B2
(45) Date of Patent: *Oct. 21, 2008

(54) METHOD FOR FABRICATING A THIN FILM AND METAL LINE OF SEMICONDUCTOR DEVICE

(75) Inventor: Han-Choon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/645,533

(22) Filed: Dec. 27, 2006

(65) Prior Publication Data

US 2007/0161241 A1    Jul. 12, 2007

(30) Foreign Application Priority Data

Dec. 29, 2005    (KR) ............... 10-2005-0134359

(51) Int. Cl.
  *H01L 21/4763*    (2006.01)
  *H01L 21/44*    (2006.01)

(52) U.S. Cl. .............. 438/627; 438/685; 257/E21.04

(58) Field of Classification Search .......... 438/627, 438/685, 584, 597, 618, 622; 257/E21.04
See application file for complete search history.

(56) References Cited

U.S. PATENT DOCUMENTS

| | | | | |
|---|---|---|---|---|
| 6,146,993 | A * | 11/2000 | Brown et al. ............... | 438/627 |
| 6,353,260 | B2 * | 3/2002 | Liu et al. ................... | 257/758 |
| 6,362,526 | B1 * | 3/2002 | Pramanick et al. .......... | 257/751 |
| 6,723,635 | B1 * | 4/2004 | Ngo et al. .................. | 438/627 |
| 6,924,207 | B2 * | 8/2005 | Son et al. ................... | 438/396 |
| 6,987,059 | B1 * | 1/2006 | Burke et al. ................ | 438/627 |
| 7,229,918 | B2 * | 6/2007 | Moon ........................ | 438/658 |
| 7,244,674 | B2 * | 7/2007 | Li et al. ..................... | 438/643 |
| 2002/0106846 | A1 * | 8/2002 | Seutter et al. .............. | 438/200 |
| 2003/0091739 | A1 * | 5/2003 | Sakamoto et al. ......... | 427/248.1 |
| 2003/0157794 | A1 * | 8/2003 | Agarwala et al. .......... | 438/627 |
| 2004/0175928 | A1 * | 9/2004 | Abell ......................... | 438/627 |
| 2004/0253160 | A1 * | 12/2004 | Jones ......................... | 423/230 |
| 2007/0155163 | A1 * | 7/2007 | Baek et al. ................. | 438/627 |
| 2007/0155169 | A1 * | 7/2007 | Baek et al. ................. | 438/637 |

* cited by examiner

*Primary Examiner*—Brook Kebede
*Assistant Examiner*—Kevin A Parendo
(74) *Attorney, Agent, or Firm*—Finnegan, Henderson, Farabow, Garrett & Dunner, L.L.P.

(57) ABSTRACT

A method for forming a thin film of a semiconductor device is provided. The method includes forming a TaN film on a semiconductor substrate, and converting a portion of the TaN film into a Ta film by reacting the TaN film with $NO_2$. The Ta film is formed to have a thickness which is about half of the thickness of the TaN film.

5 Claims, 4 Drawing Sheets

METHOD FOR FABRICATING A THIN FILM AND METAL LINE OF SEMICONDUCTOR DEVICE

RELATED APPLICATION

This application is based upon and claims the benefit of priority to Korean Application No. 10-2005-0134359, filed on Dec. 29, 2005, the entire contents of which are incorporated herein by reference.

TECHNICAL FIELD

The present invention relates to a method for forming a metal line of a semiconductor device; and, more particularly, to a method for manufacturing a semiconductor device having a copper wiring.

BACKGROUND

With the realization of high-speed and high-integration semiconductor devices, metal lines formed within semiconductor devices are becoming finer, and being formed with multi layers. In such a case, however, the widths of the metal lines get reduced as well, so that a signal delay occurs due to resistance and capacitance of the metal lines. Thus, to reduce such a signal delay, copper having a low resistance has been widely employed for the formation of metal lines.

In comparison with conventional metals employed, copper is difficult to etch. Accordingly, a copper wiring is formed through a damascene process including the steps of: forming a trench ; then forming a copper layer to fill the trench; and finally performing a chemical mechanical polishing process thereon.

Since, however, copper tends to diffuse into another layer easily, a diffusion barrier film is formed on the trench before filling the trench with copper.

Though the diffusion barrier film can be formed of Ta, a Ta film cannot prevent a diffusion of copper perfectly. For this reason, the diffusion barrier film has been formed of TaN. However, the TaN film has a defect in that its adhesive strength with copper is low, though it can prevent diffusion of copper more effectively than a Ta film.

Currently, the diffusion barrier film is formed of a dual film of Ta/TaN to improve the reliability of the semiconductor device. The dual-film diffusion barrier film can be formed by using a physical vapor deposition (PVD), an atomic layer deposition (ALD) or a chemical vapor deposition (CVD). In comparison to the CVD method or ALD method, the PVD method is simple and also a thin film formed thereby has a higher purity.

However, when the dual-film barrier layer is formed by the PVD method, there may occur an overhanging phenomenon in which an entrance of a via is blocked, if an aspect ratio of the via is great, which results in a failure to form a barrier layer appropriately.

BRIEF SUMMARY

Consistent with the present invention, there is provided a method for forming a dual film of Ta/TaN easily without causing an overhanging phenomenon.

Consistent with the present invention, there is provided a method for forming a thin film of a semiconductor device, comprising: forming a TaN film on a semiconductor substrate; and converting a portion of the TaN film into a Ta film by reacting the TaN film with $NO_2$.

Consistent with the present invention, there is also provided a method for forming a metal line of a semiconductor device, comprising: forming an interlayer insulating film on a semiconductor substrate; forming a trench on the interlayer insulating film through a selective etching process, exposing the semiconductor substrate being exposed through the trench; forming a TaN film on a semiconductor substrate; converting a portion of the TaN film into a Ta film by reacting the TaN film with $NO_2$; and forming a metal line on the Ta film.

BRIEF DESCRIPTION OF THE DRAWINGS

The above features of the present invention will become apparent from the following description of embodiments, given in conjunction with the accompanying drawings, in which.

DETAILED DESCRIPTION

Hereinafter, embodiments of the present invention will be described in detail with reference to the accompanying drawings so that the present invention may be easily implemented by those skilled in the art. However, it is to be noted that the present invention is not limited to these embodiments and can be varied in various ways.

Figure 1:
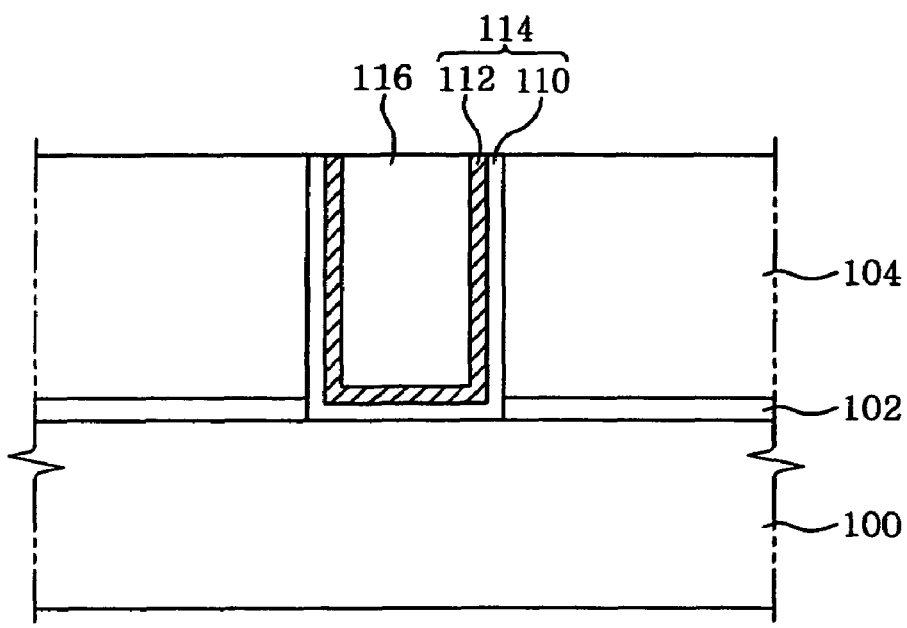
FIG. 1 is a cross sectional view of a metal line of a semiconductor device consistent with an embodiment of the present invention.

Referring to FIG. 1, there is provided a cross sectional view of a metal line of a semiconductor device in consistent with an embodiment of the present invention.

As shown in FIG. 1, an etch stop layer 102 and an interlayer insulating film 104 are formed on a substrate 100. Substrate 100 may include individual devices (not shown) or a lower conductor (not shown).

Etch stop layer 102 can be made of SiN, $SiH_4$ or the like. Interlayer insulating film 104 can be formed by depositing an organic or inorganic insulating material such as a fluorine silicate glass (FSG), an undoped silicate glass (USG), $SiH_4$, and a tetra ethylortho silicate (TEOS) in a single layer or multi layers. Alternatively, interlayer insulating layer 104 can be formed of a low-k material such as a black diamond (BD) having a dielectric constant not greater than a value of 3.0.

Figure 2:
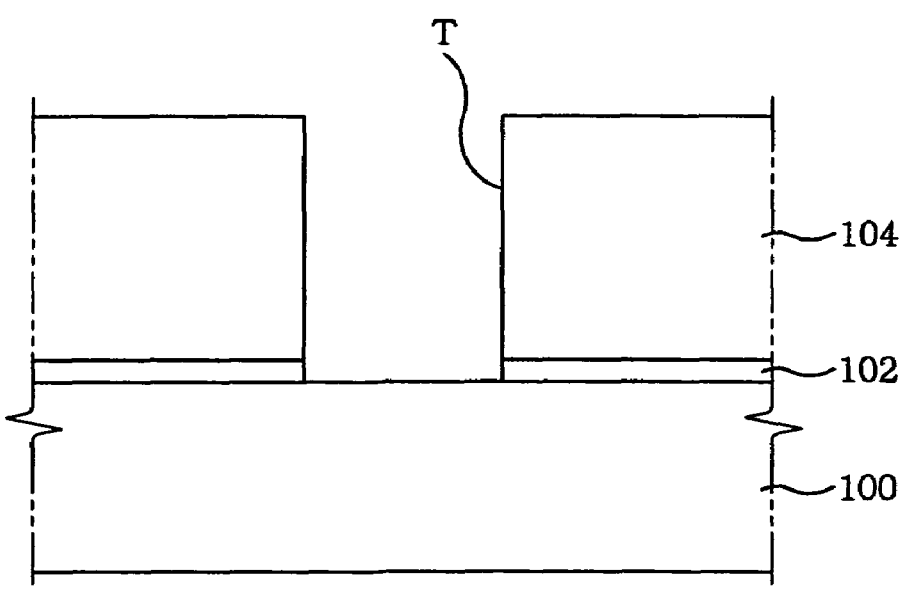
FIGS. 2 to 4 provide cross sectional views describing a method for forming the metal line of the semiconductor device shown in FIG. 1, wherein initial stages of the method are omitted.

Formed through etch stop layer 102 and interlayer insulating film 104 is a trench T (as shown in FIG. 2) through which the lower conductor or individual devices are exposed.

Further, formed inside the trench T are a barrier layer 114 and a metal line 116 that are connected to the lower conductor and the individual devices electrically.

Barrier layer 114 is formed on an inner surface of the trench T and then a trench defined by barrier layer 114 is filled with metal line 116.

Barrier layer 114 prevents a metal material of metal line 116 from diffusing into another layer such as an insulating film, while enhancing the adhesion of the insulating film and the metal line.

Further, barrier layer 114 is formed of a dual barrier structure of a first barrier metal layer 110 and a second barrier metal layer 112. First barrier metal layer 110 is formed of TaN, while second barrier metal layer 112 is formed of Ta. Metal line 116 is made of a conductive material such as copper having a low resistance.

Below, a method for forming the metal line of the semiconductor device having the above configuration will be explained with reference to FIGS. 2 and 3 together with FIG. 1.

Figure 3:
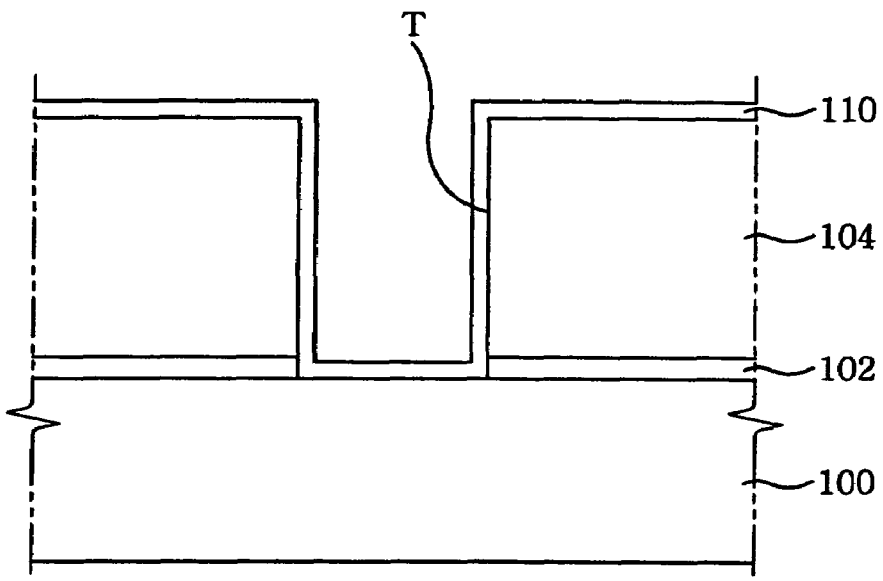

FIGS. 2 and 3 provide cross sectional views to describe the method for forming the metal line of the semiconductor fabricating method consistent with an embodiment of the present invention, wherein initial steps of the method are omitted.

As shown in FIG. 2, etch stop layer 102 and interlayer insulating film 104 are deposited on a substrate 100. Then, trench T is formed on interlayer insulating film 104 through a selective etching process using a photoresist film (not shown) such that etch stop layer 102 is partially exposed through trench T.

Thereafter, the exposed part of etch stop layer 102 is removed to expose substrate 100 partially as shown in FIG. 3. Subsequently, first barrier metal layer 110 made of TaN is formed thereon by using a PVD process.

Figure 4:
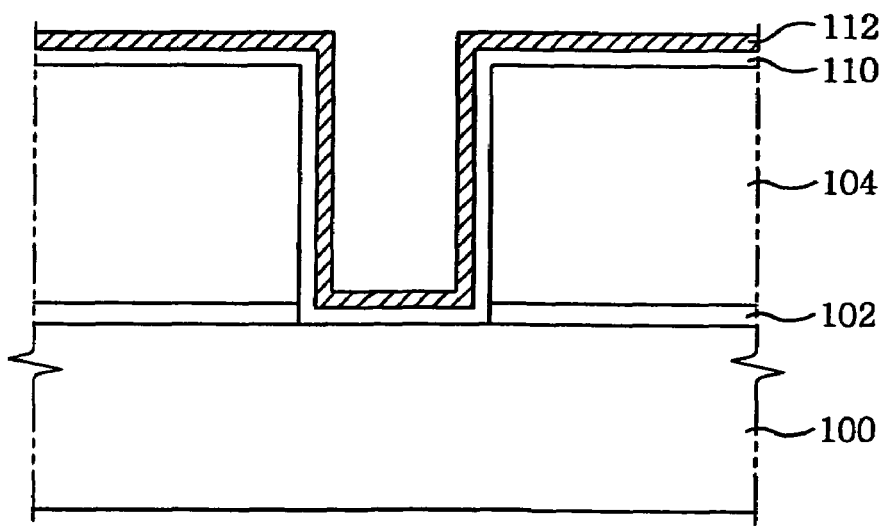

Next, a part of first barrier metal layer 110 is converted into Ta by being exposed to and reacting with $NO_2$, forming second barrier metal layer 112, as shown in FIG. 4. If $NO_2$ reacts with TaN of first barrier metal layer 110, $N_2$ and $O_2$ are generated and TaN is converted into Ta. The Ta film of second barrier metal layer 112 is formed such that its thickness is half of that of the initially formed TaN film (first barrier metal layer 110).

Then, referring back to FIG. 1, copper is deposited on the Ta film (second barrier metal layer 112), so that a copper layer that fills a trench defined by Ta film is obtained. Subsequently, by planarizing a substrate structure through a chemical mechanical polishing process, metal line 116, and barrier layer 114 are obtained.

Figure 5:
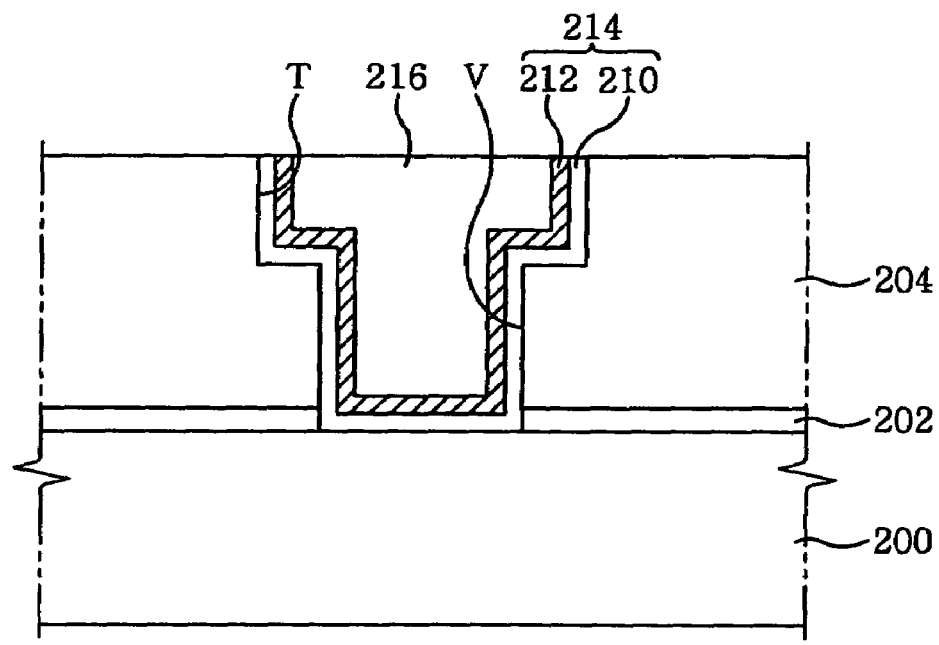
FIG. 5 is a cross sectional view of a metal line of a semiconductor device consistent with another embodiment of the present invention.

FIG. 5 is a cross sectional view of a metal line of a semiconductor device consistent with another embodiment of the present invention.

As shown in FIG. 5, an etch stop layer 202 and an interlayer insulating film 204 are formed on a substrate 200. Substrate 200 may include individual devices (not shown) or a lower conductor (not shown).

Etch stop layer 202 may be made of SiN, $SiH_4$ or the like. Interlayer insulating film 204 may be formed by depositing an organic or inorganic insulating material such as a fluorine silicate glass (FSG), an undoped silicate glass (USG), $SiH_4$, and a tetra ethylortho silicate (TEOS) in a single layer or multi layers. Alternatively, interlayer insulating layer 204 can be formed of a low-k material such as a black diamond (BD) having a dielectric constant not greater than a value of 3.0.

Formed through etch stop layer 202 and interlayer insulating film 204 is a via V for exposing the lower conductor or individual devices therethrough and interlayer insulating film 204 is provided with a trench T through which via V is exposed.

Further, formed inside trench T are a barrier layer 214 and a metal line 216 that are connected to the lower conductor and the individual devices electrically.

Barrier layer 214 is formed on an inner surface of trench T and then a via and a trench defined by barrier layer 214 is filled with metal line 216.

Barrier layer 214 prevents a metal material of metal line 216 from diffusing into another layer such as an insulating film, while enhancing the adhesion of the insulating film and the metal line.

Further, barrier layer 214 is formed of a dual barrier structure comprising a first barrier metal layer 210 and a second barrier metal layer 212. First barrier metal layer 210 is formed of TaN, while second barrier metal layer 212 is formed of Ta. Metal line 216 is made of a conductive material such as copper having a low resistance.

Below, a method for forming the metal line of the semiconductor device having the above configuration will be explained with reference to FIGS. 6 to 8 together with FIG. 5.

Figure 6:
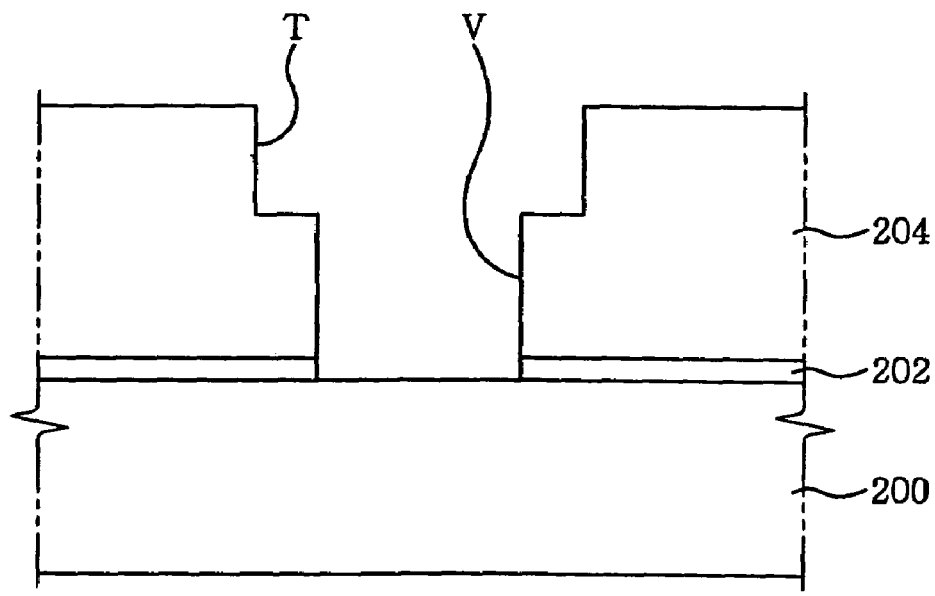
FIGS. 6 to 8 present cross sectional views describing a method for forming the semiconductor device shown in FIG. 4, wherein initial stages of the method are omitted.
Figure 7:
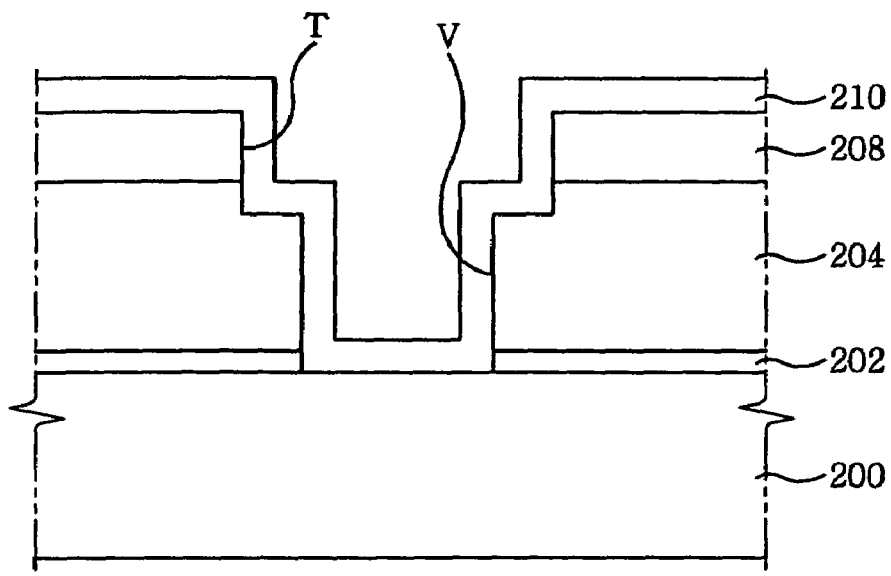
Figure 8:
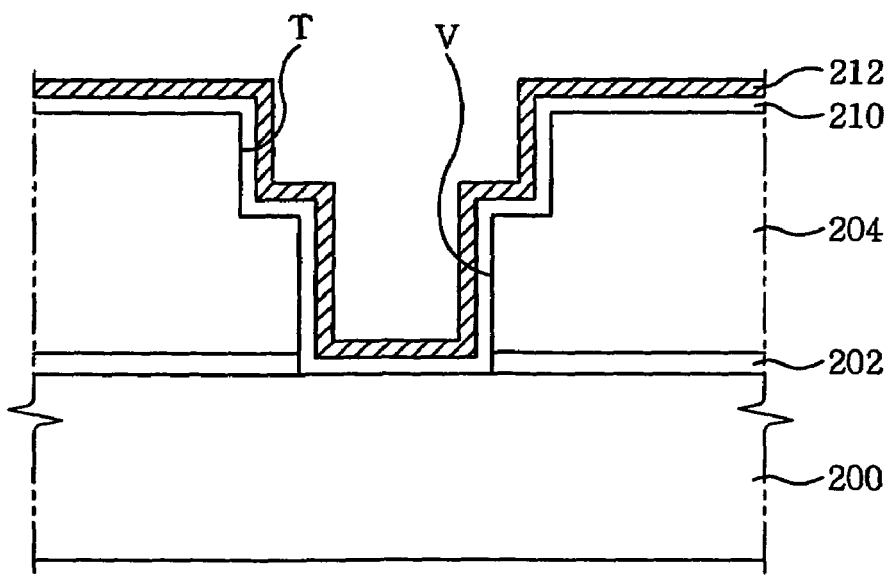

FIGS. 6 to 8 provide cross sectional views to describe the method for forming the metal line of the semiconductor fabricating method consistent with an embodiment of the present invention, wherein initial steps of the method are omitted.

As shown in FIG. 6, etch stop layer 202 and interlayer insulating film 204 are deposited on a substrate 200.

Then, via V is formed on interlayer insulating film 204 through a selective etching process using a photoresist film (not shown) such that etch stop layer 202 is partially exposed through via V. Thereafter, trench T is formed through a selective etching process using a photoresist film (not shown) such that via V is exposed therethrough. If interlayer insulating film 204 is formed in multiple layers, one of the multi layers of interlayer insulating film 204 can be used as an etch stop layer when trench T is formed.

Thereafter, as illustrated in FIG. 7, the exposed etch stop layer 202 is removed to partially expose substrate 200. Subsequently, TaN is deposited by a PVD method to form first barrier metal layer 210.

Next, a portion of first barrier metal layer 210 is converted into Ta by being exposed to and reacting with $NO_2$, forming second barrier metal layer 212, as shown in FIG. 8. If $NO_2$ reacts with TaN of first barrier metal layer 210, $N_2$ and $O_2$ are generated and TaN is converted into Ta. The Ta film of second barrier metal layer 212 is formed in such a manner that its thickness is half of that of the initially formed TaN film.

Then, referring back to FIG. 5, copper is deposited on the Ta film (second barrier metal layer 212), so that a copper layer that fills a via and a trench defined by the Ta film is obtained. Subsequently, by planarizing a substrate structure through a chemical mechanical polishing (CMP) process, metal line 216 and barrier layer 214 are obtained.

Consistent with the present invention, as described above, a dual TaN/Ta film is formed by forming a TaN film and converting a part of the TaN film into a Ta film. Specifically, if a dual film is formed thick by a PVD process as the conventional cases, there may occur an overhanging phenomenon. But, since a dual film is formed by using a single film in the present invention, the overhanging phenomenon does not occur.

While the invention has been shown and described with respect to several embodiments, it will be understood by those skilled in the art that various changes and modifications may be made without departing from the spirit and scope of the invention as defined in the following claims.

What is claimed is:

1. A method for forming a thin film of a semiconductor device, comprising:
   forming a TaN film on a substrate; and
   converting a portion of the TaN film into a Ta film by reacting the TaN film with $NO_2$, wherein the Ta film is formed to have a thickness which is about half of the thickness of the TaN film.

2. The method of claim 1, wherein the TaN film is formed by using a physical vapor deposition process.

3. A method for forming a metal line of a semiconductor device, comprising:

forming an interlayer insulating film on a semiconductor substrate;

forming a trench on the interlayer insulating film through a selective etching process exposing the substrate through the trench;

forming a TaN film on an entire surface of the resultant structure after forming the trench;

converting a portion of the TaN film into a Ta film by reacting the TaN film with $NO_2$; and forming a metal line on the Ta film, wherein the Ta film is formed to have a thickness which is about half of the thickness of the TaN film.

4. The method of claim 3, wherein the TaN film is formed by using a physical vapor deposition process.

5. The method of claim 3, wherein the metal line is formed of Cu.

\* \* \* \* \*